(12) United States Patent
Roques et al.

(10) Patent No.: US 10,992,140 B2
(45) Date of Patent: Apr. 27, 2021

(54) ELECTRICAL POWER DISTRIBUTION ASSEMBLY FOR AN AIRCRAFT

(71) Applicant: SAFRAN ELECTRICAL & POWER, Blagnac (FR)

(72) Inventors: Serge Thierry Roques, Cornebarrieu (FR); Philippe Pierre Avignon, Toulouse (FR); Jean-Marc Blineau, Aussonne (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 374 days.

(21) Appl. No.: 14/888,596

(22) PCT Filed: May 2, 2014

(86) PCT No.: PCT/FR2014/051046
§ 371 (c)(1),
(2) Date: Nov. 2, 2015

(87) PCT Pub. No.: WO2014/177817
PCT Pub. Date: Nov. 6, 2014

(65) Prior Publication Data
US 2016/0111885 A1    Apr. 21, 2016

(30) Foreign Application Priority Data
May 2, 2013    (FR) ..................................... 1354041

(51) Int. Cl.
*H02J 4/00*  (2006.01)
*B64C 7/00*  (2006.01)
*B64D 41/00* (2006.01)
*H01H 1/64*  (2006.01)
*H01H 33/02* (2006.01)
*H05K 9/00*  (2006.01)

(52) U.S. Cl.
CPC .................. *H02J 4/00* (2013.01); *B64C 7/00* (2013.01); *B64D 41/00* (2013.01); *H01H 1/64* (2013.01); *H01H 33/02* (2013.01); *H05K 9/0081* (2013.01); *B64D 2041/002* (2013.01); *B64D 2221/00* (2013.01)

(58) Field of Classification Search
CPC ....................................................... H02J 4/00
See application file for complete search history.

(56) References Cited

U.S. PATENT DOCUMENTS

| 5,594,285 | A | 1/1997 | Wisbey et al. |
| 5,612,579 | A | 3/1997 | Wisbey et al. |
| 6,211,494 | B1 * | 4/2001 | Giamati ................ B64C 1/1453 219/201 |

(Continued)

FOREIGN PATENT DOCUMENTS

| EP | 2 432 093 | 3/2012 |
| WO | 02 23688 | 3/2002 |

OTHER PUBLICATIONS

International Search Report dated Aug. 29, 2014 in PCT/FR14/051046 Filed May 2, 2014.

*Primary Examiner* — Daniel Kessie
(74) *Attorney, Agent, or Firm* — Oblon, McClelland, Maier & Neustadt, L.L.P.

(57) ABSTRACT

An electrical power distribution assembly for an airplane, the assembly including an electric switch device for placing in a Karman fairing of the airplane.

13 Claims, 4 Drawing Sheets

(56) References Cited

U.S. PATENT DOCUMENTS

| | | | |
|---|---|---|---|
| 6,544,115 B1* | 4/2003 | Graf | B60H 1/34 |
| | | | 296/78.1 |
| 7,950,606 B2* | 5/2011 | Atkey | B64D 13/08 |
| | | | 244/135 R |
| 8,155,876 B2* | 4/2012 | White | B64D 41/00 |
| | | | 701/300 |
| 8,657,227 B1* | 2/2014 | Bayliss | B64D 13/00 |
| | | | 244/58 |
| 2003/0047997 A1 | 3/2003 | Bernier | |
| 2006/0065784 A1* | 3/2006 | Rouyre | B64C 7/00 |
| | | | 244/119 |
| 2007/0108344 A1* | 5/2007 | Wood | B64C 7/00 |
| | | | 244/102 R |
| 2008/0169375 A1* | 7/2008 | Ishikawa | F02K 9/78 |
| | | | 244/12.1 |
| 2009/0015063 A1* | 1/2009 | Michalko | H02J 5/00 |
| | | | 307/19 |
| 2010/0170987 A1* | 7/2010 | Meyer | B64C 1/26 |
| | | | 244/120 |
| 2012/0086266 A1 | 4/2012 | Shipley et al. | |
| 2012/0104160 A1* | 5/2012 | Baumann | B64C 25/405 |
| | | | 244/50 |
| 2013/0037234 A1* | 2/2013 | Mackin | B64D 13/08 |
| | | | 165/41 |
| 2013/0169036 A1* | 7/2013 | Todd | B64D 33/00 |
| | | | 307/9.1 |

* cited by examiner

ELECTRICAL POWER DISTRIBUTION ASSEMBLY FOR AN AIRCRAFT

TECHNICAL BACKGROUND

The invention constituting the subject matter of the present disclosure lies in the field of electricity distribution assemblies for aircraft, and of methods of putting such assemblies into place.

Present-day airplanes, whether they be airliners, cargo airplanes, or military airplanes, are using more and more electrical power for a very large number of functions, which in the past used to be performed by hydraulic and/or pneumatic power.

Until now, the functions powered electrically have been situated in particular at the front of the airplane, close to the cockpit, as shown in FIG. 1. There can be seen the 120 VU rack, referenced 100, which is an alternating current (AC) and direct current (DC) power supply rack in A320 airplanes, which are used by way of illustration. The 120 VU rack receives electrical power from generators 110 driven by the engines and distributes it to consumers, e.g. galleys 120 located at the front of the aircraft. Away from the front of aircraft, it is commonly necessary to power other galleys located at the rear, and referenced 130.

The 120 VU rack 100 is a switching device, also referred to as an electrical master box. In general manner, such boxes are situated at the front of the aircraft under the cockpit, or at the back of the cockpit, under the flight deck. They constitute an interface between the electricity generators 110 that take power from the engines, and they distribute that power to various loads for powering. One or more auxiliary generator units 150 are also used in addition to the generators 110 that are actuated by the engines, in particular when the engines are off, and also a generator 160 that is connected to an emergency generator 165 or constant speed motor generator (CSMG). These auxiliary units (auxiliary power unit (APU), ground power unit (GPU), and CSMG) power the electrical master box 100 placed that the front of the aircraft.

However, recent models of aircraft include much more equipment that is electrically powered. Thus, provision is made for starting to be electrically-driven using an alternator/starter, for air conditioning and airplane pressurization to be performed using electrical compressors, thereby making it possible to avoid taking air from an engine, for wing and tail deicing to be performed electrically instead of by air deicing, or for braking to be electrical rather than hydraulic. An example is constituted by an electric brake unit for the main landing gear wheels (not shown). In addition, the trend for control members is to use electrohydraulic controls that require high levels of electrical power for actuating flight control surfaces, in the event of hydraulic power being lost. For example, electromechanical actuators are known that control ailerons and electronic power controls that control an actuator for reversing thrust. It is also possible for electrical power to be used to actuate air brakes, wing flaps, and slats. Proposals have also been made to move landing gear using electrical power and to enable an airplane to taxi on the ground, likewise using electrical power only.

The total electrical power needed in certain aircraft requires an availability of 1000 kilovolt amps (kVA), or even more.

Devices that consume electrical power (loads) are present in numerous zones of aircraft. Powering them from an electrical master box at the front of the airplane requires cables to run over long distances. Furthermore, the ability to be able to take action very quickly on electrical master boxes, while the aircraft is on the ground between two flights, is being required more and more, both because the users of aircraft desire to use them without losing time, and because more and more on-board devices are powered electrically, as mentioned above.

DEFINITION OF THE INVENTION AND ITS ASSOCIATED ADVANTAGES

In order to satisfy the above-described constraints, there is proposed an electrical power distribution assembly for an airplane comprising an electric switch device for placing in a Karman fairing of the airplane.

By means of this novel configuration, it is possible to install the electrical master boxes on the most direct path for powering the electrical loads, thereby minimizing cable lengths, in particular the lengths of power cables, which are heavy and difficult to install, and thus releasing internal volume for providing more room for the spaces for use in operating the airplane (passenger cabin, baggage holds, ... ).

A secondary electric switch device is for placing in a rear hold triangle of the airplane. Placing the boxes in the Karman fairing and in the hold triangle serves to improve access for maintenance purposes, giving rapid access to the components without it being necessary to unload passengers or payload.

An airplane is also proposed that includes an electrical power distribution assembly as described, and wherein a bronze grid is positioned so as to reduce the electromagnetic field in the Karman fairing, and/or wherein a Venturi tube provides a leak of air from the cabin into the Karman fairing in order to maintain a temperate temperature in the Karman fairing. By means of these characteristics, the switch is protected from certain physical conditions that might be encountered in the Karman fairing.

There is also provided a method of putting the electrical power distribution into place in an airplane, which method includes putting an electric switch device into place in a Karman fairing of the airplane. This method presents the same advantages as the above-mentioned electrical distribution assembly.

LIST OF FIGURES

DETAILED EMBODIMENT

Figure 2:
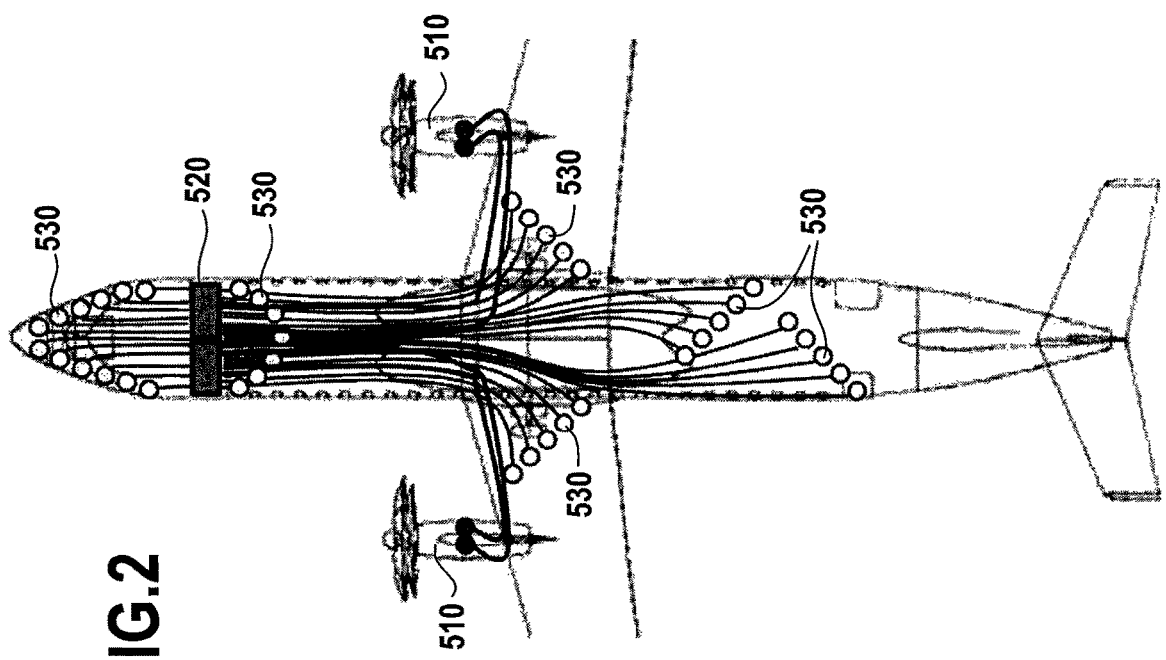
FIG. 2 shows a variant prior art electricity distribution architecture.

In FIG. 2, there can be seen the electrical power distribution network as it exists in an airplane, which may be a transport airplane or an airliner, or indeed a fighter. Power is taken from jets 510 placed on the wings and is conveyed in the form of electricity to distribution boxes 520 placed at the front of the airplane. In this example, two boxes are shown, providing an architecture in which distribution is redundant as is preferable for reasons of safety. Cables run from these master boxes 520 to take power to loads 530 in the nose of the airplane, close to the cockpit or in the cockpit, in the wings, and in the fuselage at its rear end. Thus, some of the electrical power is taken from the jets, to the front of the airplane, and then to the airplane, which constitutes a path that is long, as is made necessary by switching being centralized in boxes that are situated at the front only.

Figure 1:
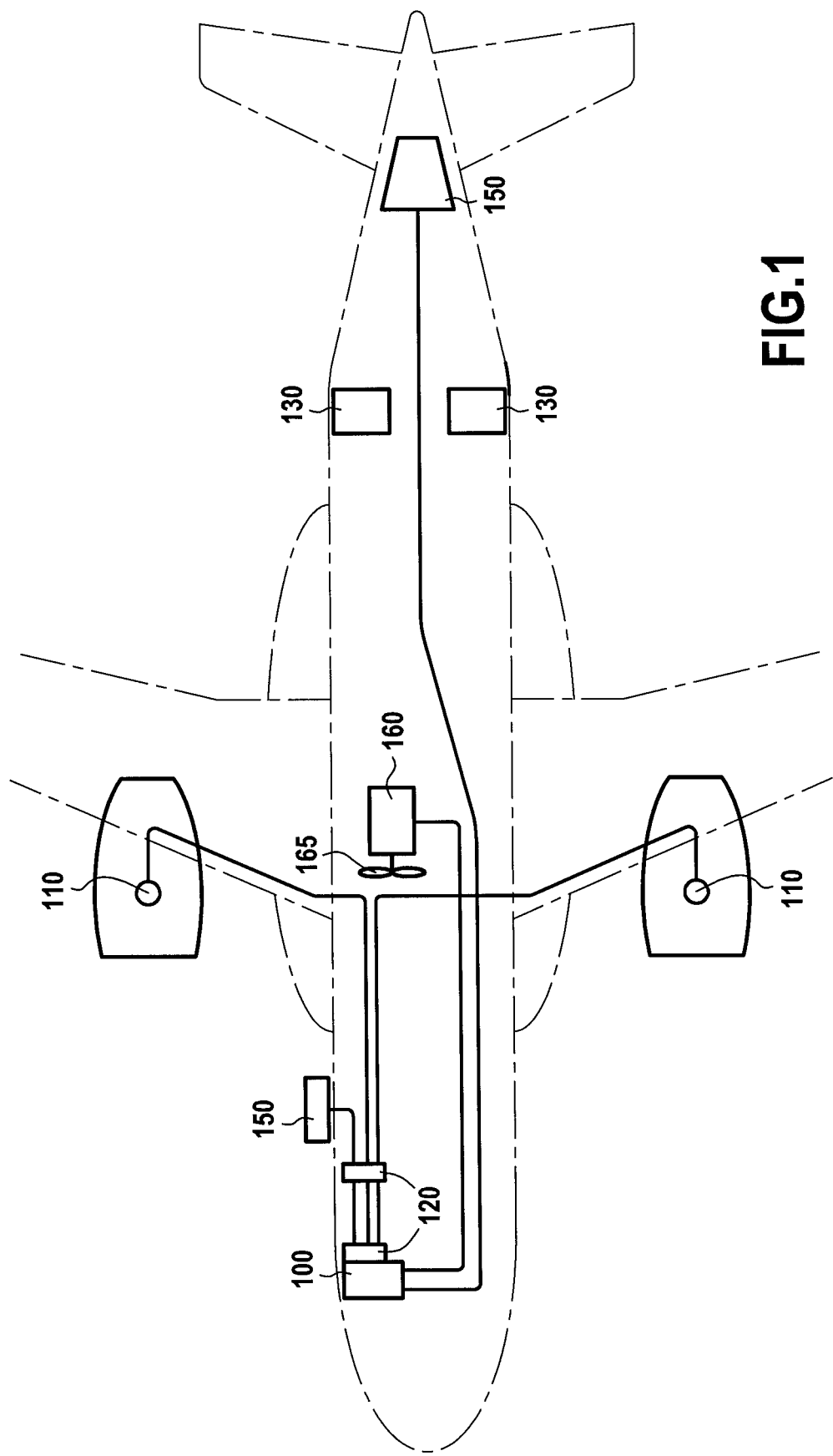
FIG. 1 shows the electricity distribution architecture on current airplanes.
Figure 3:
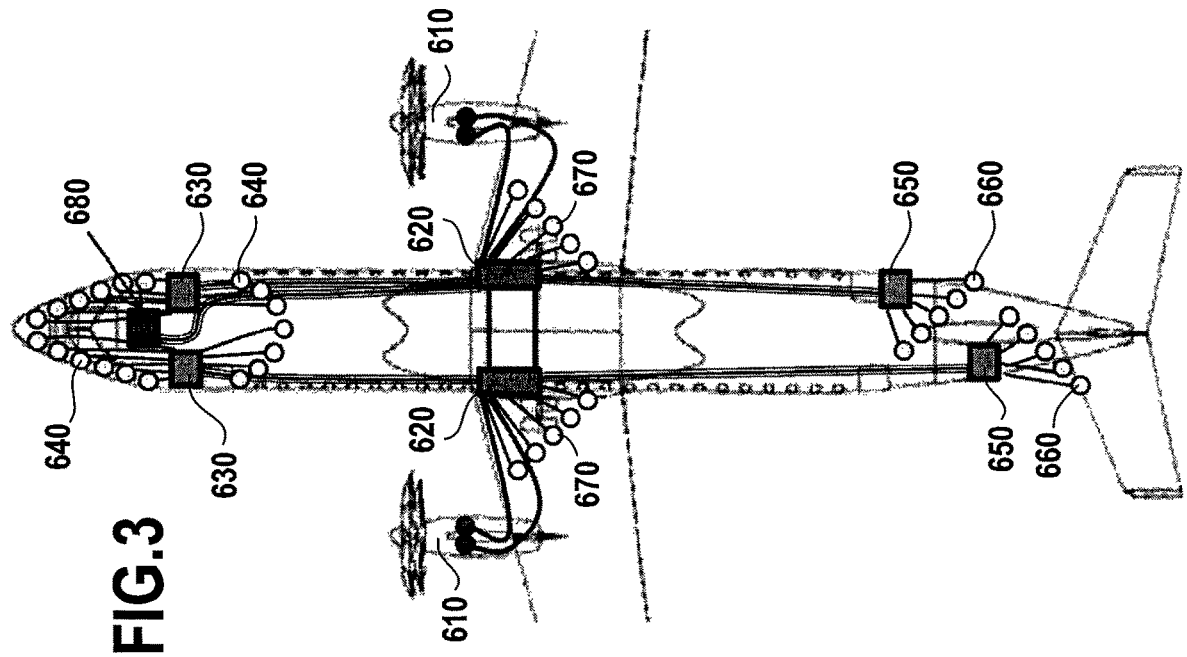
FIG. 3 shows an electricity distribution architecture in accordance with the present disclosure.

FIG. 3 shows a new electrical power distribution network. The power is obtained from the jets 610 and then conveyed along a relatively short path to electricity master boxes that are referred to as primary boxes and referenced 620, which boxes are located in the fairing at the junction between the wing and the fuselage, known as the Karman fairing. There are two primary boxes, one on each side, and each of them receives power supplied by the jet that is situated on the same side. From these primary boxes, cables run to secondary boxes 630 situated at the front of the airplane. There are two of these secondary boxes 630. They distribute electrical power to loads 640 situated at the front of the airplane, in the cockpit, or in the proximity of the cockpit. Other cables take power from the primary boxes 620 to secondary boxes 650 that are located at the rear of the fuselage and that power loads 660 placed at the rear of the airplane. The primary boxes 630 also power directly loads 670 that are placed in the proximity of the airplane wings, such as fuel pumps, means for conditioning, pressurizing, ventilating, and recirculating cabin air, electric braking, retracting or extending landing gear under electrical drive, and taxiing on the ground under electrical propulsion. The airplane also has an emergency electricity master box 680 located at the front of the aircraft.

Figure 4:
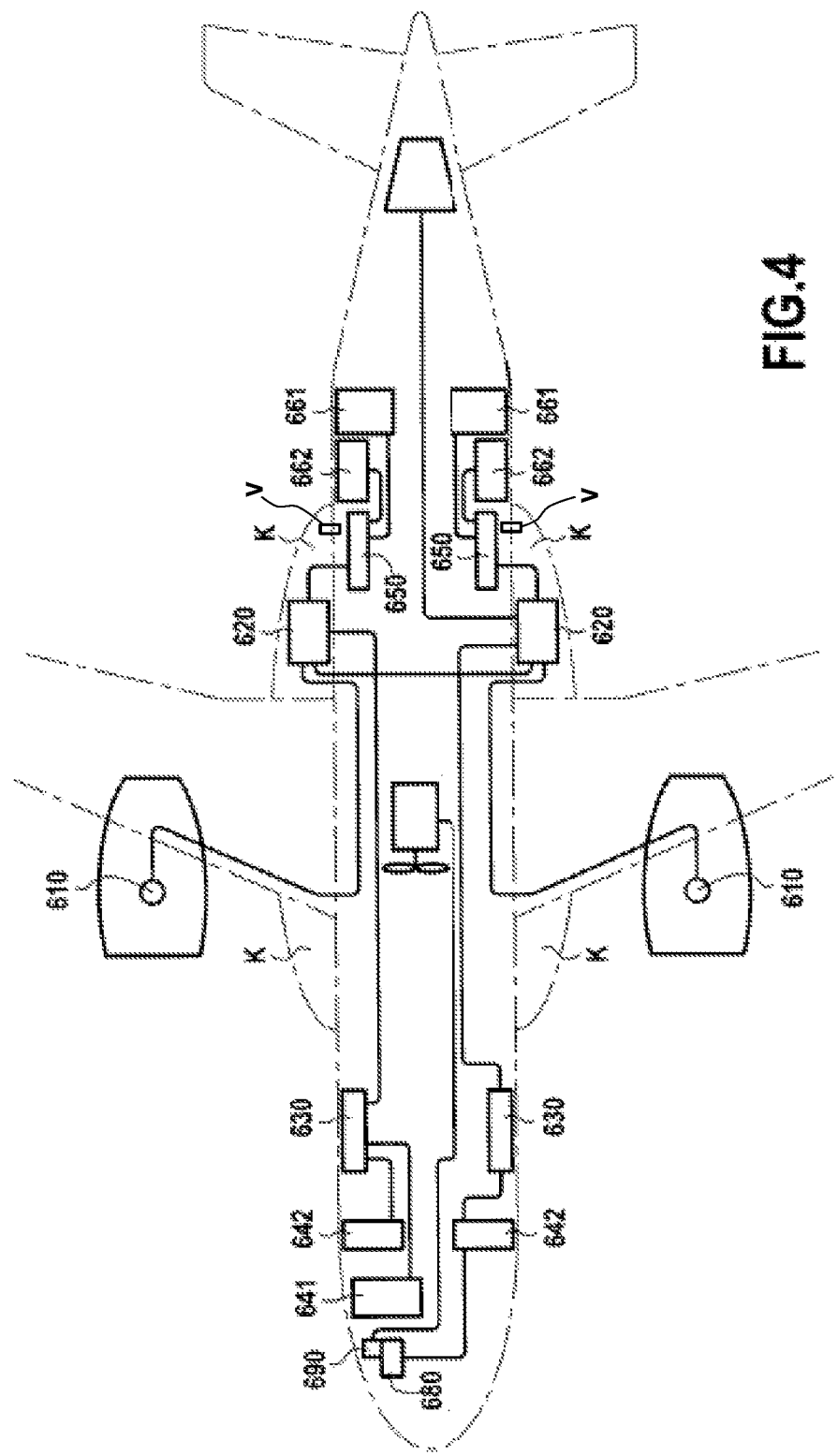
FIG. 4 shows another electricity distribution architecture in accordance with the present disclosure.

FIG. 4 shows other aspects of the above-mentioned principles. Once more, there can be seen the generators 610 at the jets, the primary boxes 620, the front secondary boxes 630, the rear secondary boxes 650, and the emergency electricity master box 680. A DC distribution system 690 is also present.

Loads located at the front are also shown, in particular a galley 641 and two avionics modules 642, to the left and to the right inside the fuselage. Each of them is powered by the corresponding front secondary box 630. Loads placed at the rear are also shown, in particular two galleys 661 on the left and on the right, and two avionics modules 662, on the left and on the right. Each of them is powered by the corresponding rear secondary box 650.

The primary boxes 620 perform the primary distribution function, and they contain contactors and remote control circuit breakers (RCCBs). On each side, they are placed in the Karman fairing K of the airplane, in this example in the rear fairings.

The rear secondary boxes 650 are located by way of example in the rear hold triangles. They may include a static circuit breaker, i.e. using solid state electronics or a solid state power controller (SSPC). The front secondary boxes 630 may include a conventional circuit breaker.

The locations of the primary and secondary boxes enable them to be repaired at the last minute prior to takeoff, when the aircraft is already loaded with passengers or freight, without disturbing loading operations or passenger comfort.

Figure 5:
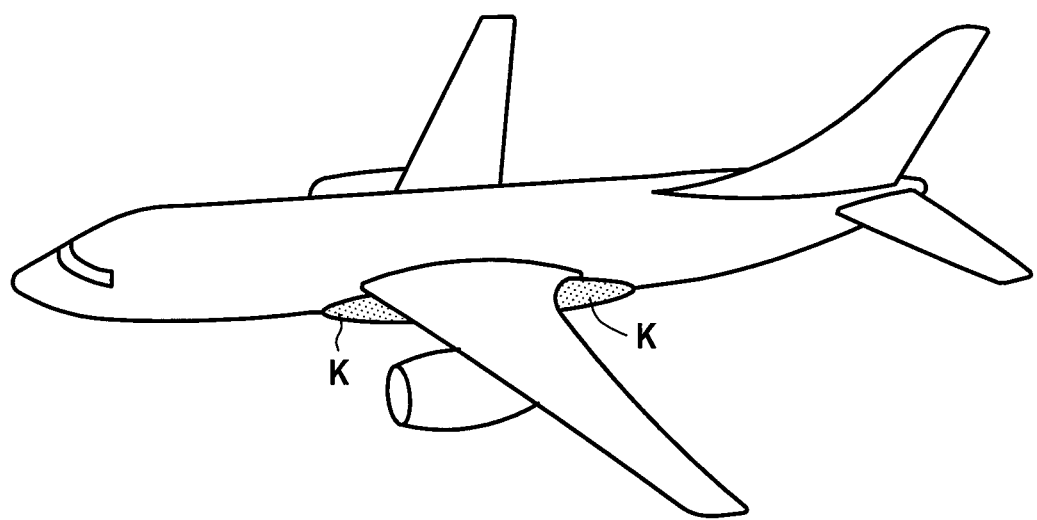
FIG. 5 shows a particular aspect of the new architecture.

FIG. 5 is an outside view of the Karman fairing of an airplane. It constitutes an aerodynamic bulge situated at the junction between the wings and the fuselage. Its inside volume is not pressurized. The primary boxes 620 are located inside respective ones of these Karman fairings, on the left of the aircraft and on the right of the aircraft. In variants, they may be situated in the top Karman fairing or the bottom Karman fairing, or in the front Karman fairing or the rear Karman fairing. It is specified that in FIG. 4, the primary boxes are shown as being in the rear Karman fairings K.

In order to ensure that the temperature inside the Karman fairing does not drop excessively in flight, which would lead to troublesome expansions of metal parts in the contactors, a Venturi tube V causes air to leak from the cabin into the Karman fairing. This air is conditioned, which means that the temperature in the fairing can be prevented from varying excessively, e.g. it can be maintained in the range $-10°$ C. to $+70°$ C. on the ground or in flight, thus enabling the contactors to operate without problem.

Furthermore, a grid made of bronze (or some other electrically conductive material) is positioned to cover the outside surface of the fuselage belly panels between the wings (i.e. the belly fairing) in order to reduce the electromagnetic field in the Karman fairing, thereby providing protection against electromagnetic interference (EMI) and against high intensity radiation fields (HIRF), such as a radar wave field, or the wave field from a powerful radio antenna), compatible with locating the primary boxes in this zone of the airplane.

The elements constituting the contactors of the primary electrical master boxes are placed in the Karman fairings, i.e. in a zone that is not pressurized, where pressure may drop to 0.3 bar. The contactors are reinforced so as to avoid electric arcs forming in the insulation while the aircraft is in flight (arcs known as Paschen discharges). The reinforcement is defined to correspond to the power and the electric voltages of the network on board the airplane in question. The contactors are also proof against water runoff in order to avoid the short circuits that could be caused by moisture that might form in the Karman fairing, or from water spray penetrating into the fairing.

The invention is not limited to the embodiments described, but extends to any variant in the ambit of the scope of the claims.

The invention claimed is:

1. An airplane comprising:
    an electrical power distribution assembly for an airplane, the electrical power distribution assembly comprising
        a primary electric switch device located in a Kaman fairing of the airplane, the Karman fairing including an aerodynamic bulge situated at a junction between a wing of the airplane and a fuselage of the airplane, an interior volume of the Karman fairing being not pressurized, the primary electric switch device receiving power from a jet of the airplane via a first cable, the primary electric switch including contactors and a circuit breaker and providing power to a first load provided in proximity to the wing of the airplane, and
        a secondary electric switch device disposed in the fuselage of the airplane and electrically connected to the primary electric switch device via a second cable so as to receive power from the primary electric switch device, the secondary electric switch device including a circuit breaker and providing power to a second load provided in the fuselage of the airplane,
    wherein a venturi tube causes air to leak from the cabin into the Karman fairing so that a temperature inside the Karman fairing does not drop below a threshold temperature,
    wherein a grid made of electrically conductive material is positioned so as to reduce an electromagnetic field in the Karman fairing, and wherein the contactors of the primary electric switch device are reinforced and proof against water runoff.

2. The airplane according to claim 1, wherein the primary electric switch device is adapted to perform primary distribution of electrical power from its generation to consumer devices.

3. The airplane according to claim 1, wherein the secondary electric switch device is placed in a rear hold triangle of the airplane.

4. The airplane according to claim 3, wherein the second cable is longer than the first cable.

5. The airplane according to claim 1, wherein the secondary electric switch device is placed at a front of the airplane.

6. The airplane according to claim 5, wherein the second cable is longer than the first cable.

7. The airplane according to claim 1, wherein the primary electric switch device is located in a top Karman fairing.

8. The airplane according to claim 1, wherein the primary electric switch device is located in a bottom Karman fairing.

9. The airplane according to claim 1, wherein a portion of the venturi tube is provided on the Karman fairing.

10. A method of putting electrical power distribution into place in an airplane comprising:
  placing a primary electric switch device in a Karman fairing of the airplane, the Karman fairing including an aerodynamic bulge situated at a junction between a wing of the airplane and a fuselage of the airplane, an interior volume of the Karman fairing being not pressurized, the primary electric switch device receiving power from a jet of the airplane via a first cable, the primary electric switch including contactors and a circuit breaker and providing power to a first load provided in proximity to the wing of the airplane, the contactors of the primary electric switch device being reinforced and proof against water runoff;
  placing a secondary electric switch device in the fuselage of the airplane, the second electric switch device being electrically connected to the primary electric switch device via a second cable so as to receive power from the primary electric switch device, the secondary electric switch device including a circuit breaker and providing power to a second load provided in the fuselage of the airplane;
  providing a venturi tube which causes air to leak from the cabin into the Karman fairing so that a temperature inside the Karman fairing does not drop below a threshold temperature; and
  positioning a grid made of electrically conductive material so as to reduce an electromagnetic field in the Karman fairing.

11. The method according to claim 10,
  wherein the secondary electric switch device is placed in a rear hold triangle of the airplane,
  and
  wherein the second cable is longer than the first cable.

12. The method according to claim 10,
  wherein the secondary electric switch device is placed in a front of the airplane,
  and
  wherein the second cable is longer than the first cable.

13. The method according to claim 10, wherein a portion of the venturi tube is provided on the Karman fairing.

* * * * *